(12) United States Patent
Cami Gonzalez

(10) Patent No.: US 12,088,411 B2
(45) Date of Patent: Sep. 10, 2024

(54) CYCLIC REDUNDANCY CHECK (CRC) GENERATION

(71) Applicant: SEMICONDUCTOR COMPONENTS INDUSTRIES, LLC, Phoenix, AZ (US)

(72) Inventor: Sergi Cami Gonzalez, Thacham (GB)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/822,329

(22) Filed: Aug. 25, 2022

(65) Prior Publication Data

US 2024/0072933 A1    Feb. 29, 2024

(51) Int. Cl.
*H04L 1/00*    (2006.01)

(52) U.S. Cl.
CPC .......... *H04L 1/0061* (2013.01); *H04L 1/0079* (2013.01)

(58) Field of Classification Search
None
See application file for complete search history.

(56) References Cited

U.S. PATENT DOCUMENTS

| | | | | |
|---|---|---|---|---|
| 5,619,516 A | * | 4/1997 | Li .................... | H03M 13/091 714/757 |
| 8,352,829 B1 | * | 1/2013 | Pathakota ........... | H03M 13/093 714/758 |
| 9,720,767 B2 | * | 8/2017 | Kasahara ............. | G06F 11/00 |
| 10,790,852 B2 | * | 9/2020 | Kalam .............. | H03M 13/6502 |
| 11,082,067 B1 | * | 8/2021 | Ruan .................... | G06F 1/03 |
| 2012/0192044 A1 | | 7/2012 | Shafai et al. | |
| 2014/0026021 A1 | * | 1/2014 | Hill .................... | G06F 11/1004 714/E11.032 |
| 2014/0281844 A1 | | 9/2014 | Jiang et al. | |
| 2017/0063493 A1 | * | 3/2017 | Mundhada ......... | H03M 13/091 |
| 2017/0075754 A1 | * | 3/2017 | Wang ................ | G06F 11/1004 |
| 2020/0319969 A1 | * | 10/2020 | Chu .................... | G06F 11/1076 |
| 2021/0111996 A1 | * | 4/2021 | Pismenny ............. | H04L 12/413 |

* cited by examiner

*Primary Examiner* — Mujtaba M Chaudry
(74) *Attorney, Agent, or Firm* — Treyz Law Group, P.C.; Tianyi He

(57) ABSTRACT

A system such as an imaging system may include Cyclic Redundancy Check (CRC) value generation circuitry. The CRC value generation circuitry may include a data splitter that splits an input data bit stream instead multiple split data bit streams each inserted with a number of bits having a value of 0. A plurality of CRC value generators may each have a corresponding input path to receive a respective one of the split data bit streams and generate corresponding partial CRC values. A data combiner coupled to the plurality of Cyclic Redundancy Check value generators may combine the partial CRC values to generate a final CRC value. A normalizer may be coupled between each of the plurality of CRC generators and the data combiner. Two CRC value data storage structures may help the plurality of Cyclic Redundancy Check value generators and the data combiner perform the desired CRC computations.

20 Claims, 5 Drawing Sheets

FIG. 4

CYCLIC REDUNDANCY CHECK (CRC) GENERATION

BACKGROUND

This relates generally to data error detection, and more particularly, to systems generating Cyclic Redundancy Check (CRC) values.

Electronic devices such as cellular telephones, cameras, and computers may use image sensors to capture images. The image sensor can include an array of image pixels arranged in pixel rows and pixel columns. Readout circuitry coupled to the image pixels can generate image data based on image signals from the image pixels.

To perform error detection, the image sensor can generate CRC values based on the generated image data. As image sensors are producing larger (higher resolution) images and are operated using faster clocks, improved CRC value determination schemes are desired to accommodate the ever-increasing amount of image data output at ever-increasing data rates. Improved CRC value determination schemes are similarly desired to more efficiently determine CRC values for other (non-image) types of data.

It is within this context that the embodiments described herein arise.

BRIEF DESCRIPTION OF THE DRAWINGS

FIG. 4 is a diagram of illustrative split data streams in accordance with some embodiments.

DETAILED DESCRIPTION

Embodiments of the present technology relate to generation of Cyclic Redundancy Check (CRC) values. It will be recognized by one skilled in the art that the present exemplary embodiments may be practiced without some or all of these specific details. In other instances, well-known operations have not been described in detail in order not to unnecessarily obscure the present embodiments.

Configurations in which CRC value calculation circuitry generate CRC values for image or video data are sometimes described herein as an example. However, this is merely illustrative. If desired, CRC value calculation circuitry may receive any other type of data other than image data and generate CRC values for the non-image data. Further details for CRC value calculation circuitry and the generation of CRC values are provided below.

Electronic devices such as digital cameras, computers, cellular telephones, and other electronic devices may produce data for which CRC values and/or other error-detecting code values may be generated. As an illustrative example described herein, electric devices may include one or more image sensors that gather incoming light to capture one or more images. CRC values may be generated based on the image data.

Figure 1:
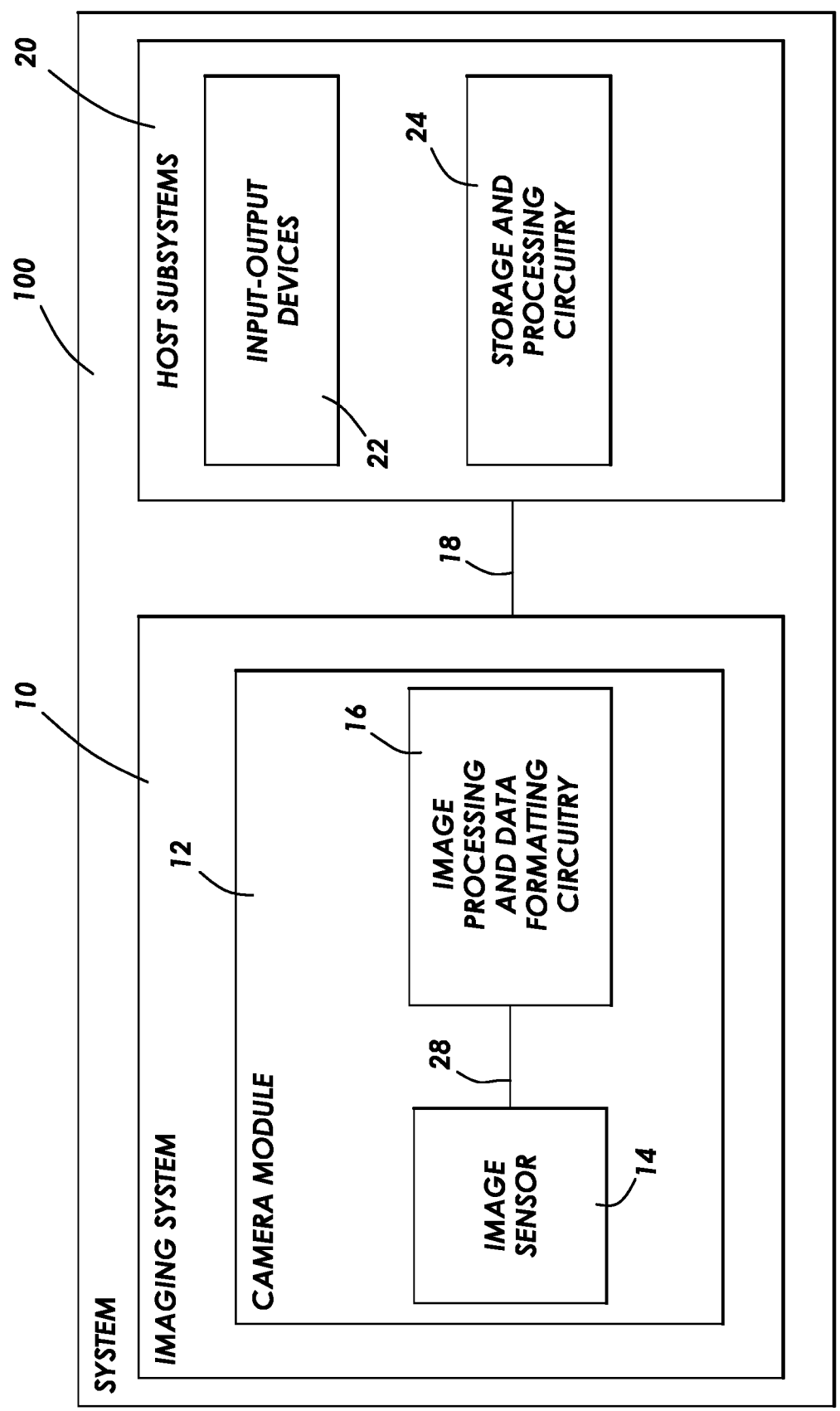
FIG. 1 is a diagram of an illustrative system in which Cyclic Redundancy Check (CRC) values are generated in accordance with some embodiments.

FIG. 1 is a diagram of an illustrative system with an imaging system that uses an image sensor to capture images based on which CRC values are generated. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14, such as in an image sensor array integrated circuit, and one or more lenses.

During image capture operations, each lens may focus light onto an associated image sensor 14. Image sensor 14 may include photosensitive elements (one or more of which in each corresponding image sensor pixel) that convert the light into digital data. Image sensors may have any number of pixels (e.g., hundreds, thousands, millions, or more). A typical image sensor may, for example, have millions of pixels (e.g., megapixels).

Each image sensor in camera module 12 may be identical or there may be different types of image sensors in a given image sensor array integrated circuit. In some examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), and/or address circuitry.

Still and video image data from sensor 14 may be provided to image processing and data formatting circuitry 16 via path 28. Image processing and data formatting circuitry 16 may be used to perform image processing functions such as data formatting, adjusting white balance and exposure, implementing video image stabilization, or face detection. Image processing and data formatting circuitry 16 may additionally or alternatively be used to compress raw camera image files if desired (e.g., to Joint Photographic Experts Group or JPEG format).

In one example arrangement, such as a system on chip (SoC) arrangement, sensor 14 and image processing and data formatting circuitry 16 are implemented on a common semiconductor substrate (e.g., a common silicon image sensor integrated circuit die). If desired, sensor 14 and image processing circuitry 16 may be formed on separate semiconductor substrates. For example, sensor 14 and image processing circuitry 16 may be formed on separate substrates that have been stacked.

Imaging system 10 may convey acquired image data to host subsystem 20 over path 18. Host subsystem 20 may include input-output devices 22 and storage processing circuitry 24. Host subsystem 20 may include processing software for detecting objects in images, detecting motion of objects between image frames, determining distances to objects in images, or filtering or otherwise processing images provided by imaging system 10. For example, image processing and data formatting circuitry 16 of the imaging system 10 may communicate the acquired image data to storage and processing circuitry 24 of the host subsystems 20.

If desired, system 100 may provide a user with numerous high-level functions. In a computer or cellular telephone, for example, a user may be provided with the ability to run user applications. For these functions, host subsystem 20 may include input-output devices 22 such as keypads, input-output ports, buttons, and displays and storage and processing circuitry 24. Storage and processing circuitry 24 of host subsystem 20 may include volatile and/or nonvolatile memory (e.g., random-access memory, flash memory, hard drives, solid-state drives, etc.). Storage and processing circuitry 24 may additionally or alternatively include microprocessors, microcontrollers, digital signal processors, and/or application specific integrated circuits.

To provide error detection and/or error correction functionalities, system 100 may include CRC generation circuitry, sometimes referred to as CRC value generation or calculation circuitry. CRC generation circuitry may be configured to generate CRC values for the image data produced by one or more image sensors 14 and/or for non-image data produced by other parts of system 100. As an example, image processing circuitry 16 may include the CRC generation circuitry for image data. As another example, storage and processing circuitry 24 may include the CRC generation circuitry for image data and/or non-image data. In other examples, other portions of system 100 may include the CRC generation circuitry.

Figure 2:
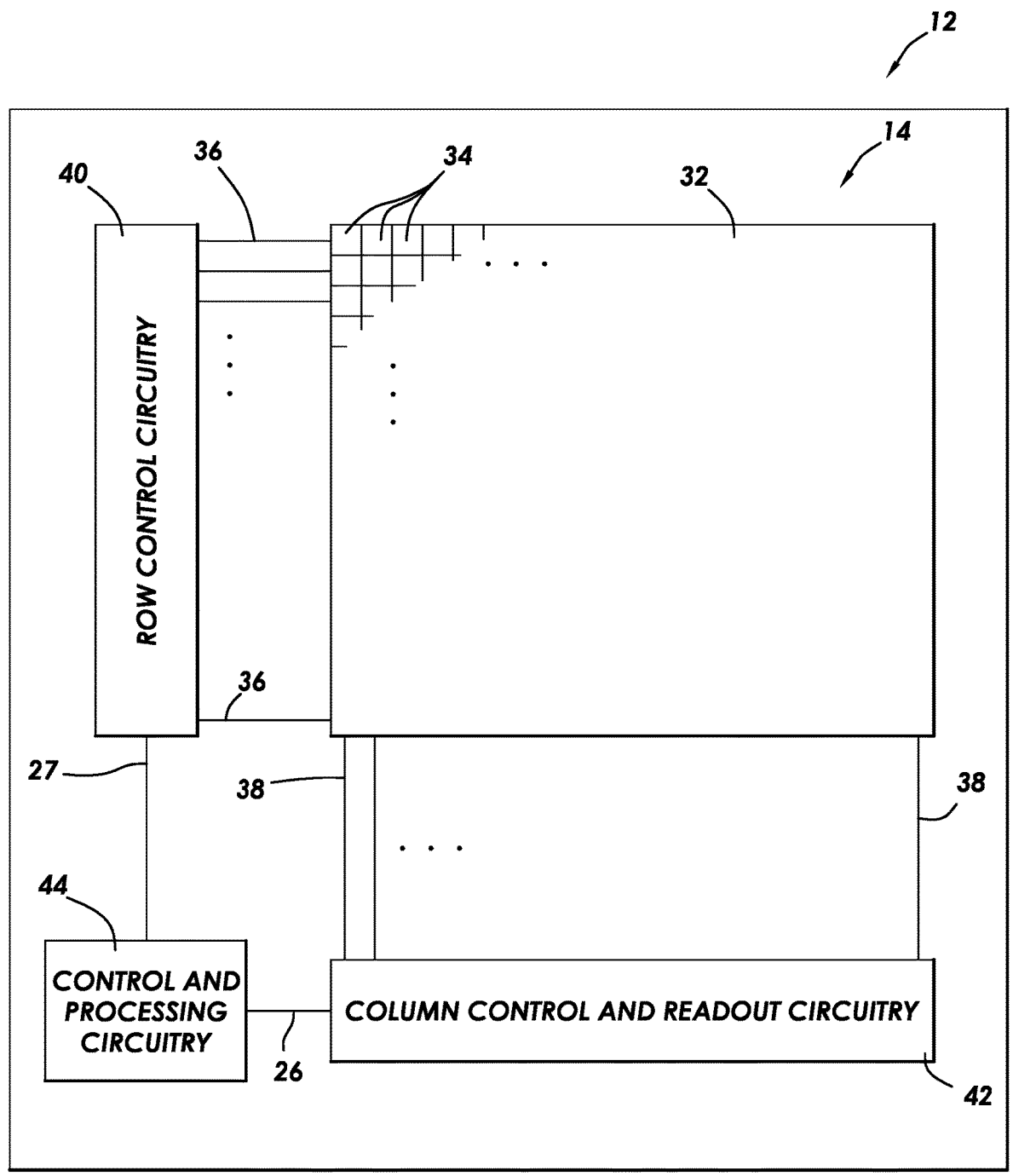
FIG. 2 is a diagram of an illustrative image sensor that produces image data with which CRC values are generated in accordance with some embodiments.

An example of an arrangement of image sensor 14 of FIG. 1 is shown in FIG. 2. As shown in FIG. 2, image sensor 14 may include control and processing circuitry 44. Control and processing circuitry 44 (sometimes referred to as control and processing logic) may be part of image processing and data formatting circuitry 16 in FIG. 1 or may be separate from circuitry 16. Image sensor 14 may include a pixel array such as array 32 of pixels 34 (sometimes referred to herein as image sensor pixels, imaging pixels, or image pixels). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over one or more control paths 36. The row control signals may include pixel reset control signals, charge transfer control signals, blooming control signals, row select control signals, dual conversion gain control signals, or any other desired pixel control signals.

Column control and readout circuitry 42 may be coupled to one or more of the columns of pixel array 32 via one or more conductive lines such as column lines 38. A given column line 38 may be coupled to a column of image pixels 34 in image pixel array 32 and may be used for reading out image signals from image pixels 34 and for supplying bias signals (e.g., bias currents or bias voltages) to image pixels 34. In some examples, each column of pixels may be coupled to a corresponding column line 38. For image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, or column memory for storing the readout signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure. Features described herein as rows may be arranged vertically and features described herein as columns may be arranged horizontally.

Pixel array 32 may be provided with a color filter array having multiple color filter elements which allows a single image sensor to sample light of different colors. As an example, image sensor pixels such as the image pixels in array 32 may be provided with a color filter array which allows a single image sensor to sample red, green, and blue (RGB) light using corresponding red, green, and blue image sensor pixels. The red, green, and blue image sensor pixels may be arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another example, broadband image pixels having broadband color filter elements (e.g., clear color filter elements, yellow color filter elements, etc.) may be used instead of green pixels in a Bayer pattern. These examples are merely illustrative and, in general, color filter elements of any desired color and in any desired pattern may be formed over any desired number of image pixels 34.

As described above in connection with FIG. 2, pixels 34 in pixel array 32 may produce image data associated with one or more image frames such as a still image or a video. To help verify the integrity of the generated image data, system 100 may include CRC generation circuitry. The CRC generation circuitry may be implemented as part of readout circuitry 42, control and processing circuitry 44, image processing circuitry 16, and/or storage and processing circuitry 24.

In one illustrative arrangement, the CRC generation circuitry may generate a corresponding CRC value for each corresponding image frame. In another illustrative arrangement, the CRC generation circuitry may generate a corresponding CRC value for only a portion of the image frame such as for image data from a single row of image pixels 34, for image data from multiple but not all rows of image pixels 34, for image data from a column of image pixels 34, and/or for image data from multiple but not all columns of image pixels 34. In yet another illustrative arrangement, the CRC generation circuitry may generate a corresponding CRC value for based on image data from multiple image frames.

Regardless of the amount of the image data based on which each CRC value is generated, it may be desirable to implement CRC generation circuitry with high throughput. In particular, as image sensors produce larger images to meet image resolution requirements and/or are operated at higher clock rates to meet frame rate requirements, the CRC generation circuitry may be configured to accommodate ever-increasing amounts image data produced at ever-increasing data rates using improved CRC value determination schemes.

Figure 3:
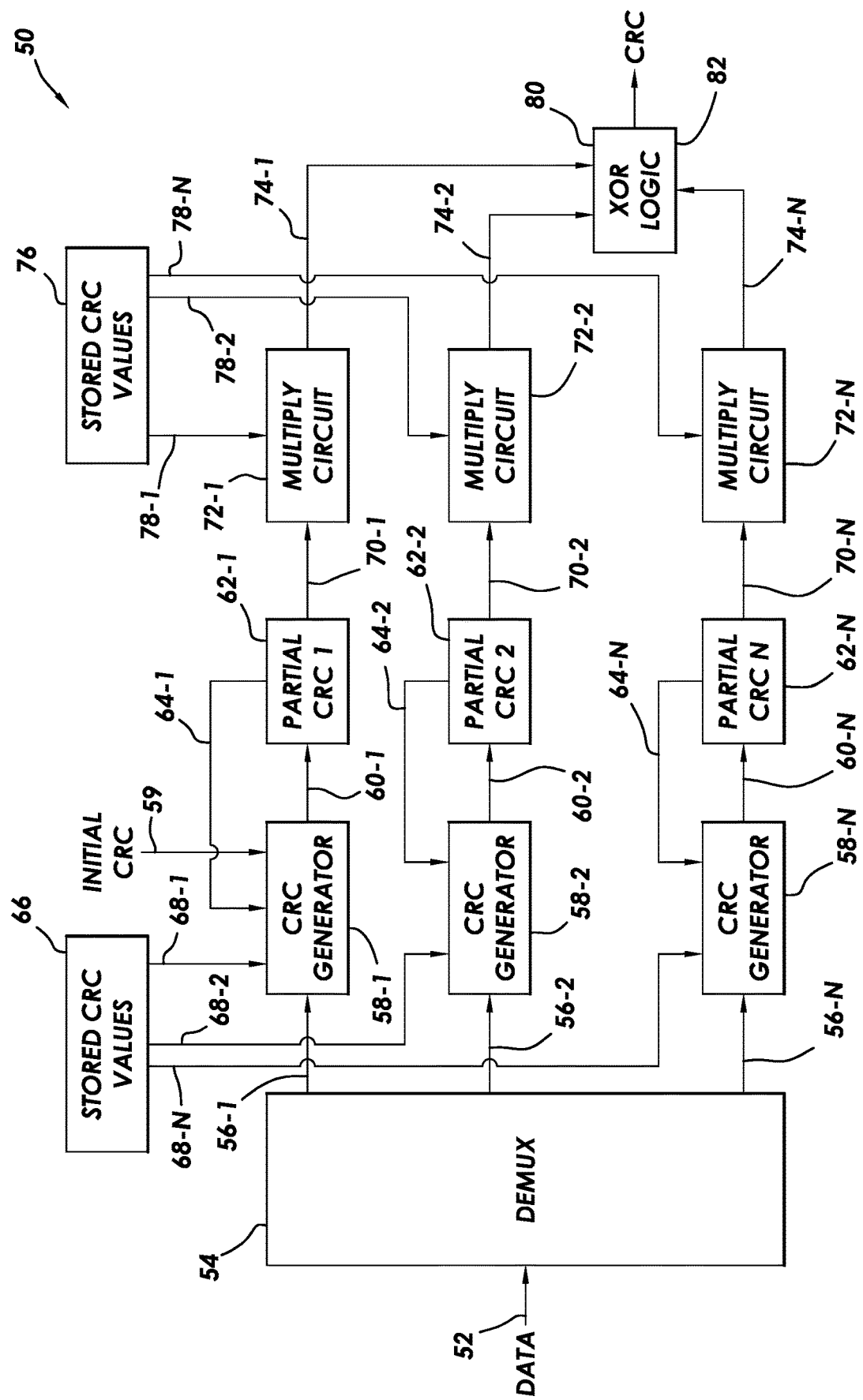
FIG. 3 is a diagram of illustrative CRC value calculation circuitry in accordance with some embodiments.

FIG. 3 is a block diagram of illustrative CRC generation circuitry such as CRC (value) generation circuitry 50. In particular, CRC generation circuitry 50 may use parallelized CRC computation and include stored pre-computed CRC values to provide a more efficient (e.g., faster) CRC determination scheme while only maintaining relatively small number of pre-computed CRC values.

As shown in FIG. 3, CRC generation circuitry 50 may include an input path such as input line 52 at which an input data (bit) stream is received by CRC generation circuitry 50. To parallelize CRC value computation, the input data stream may be split include N number of split data (bit) streams by a data splitter in CRC generation circuitry 50. In particular, a data splitter such as demultiplexer 54 may perform a time division demultiplexing operation and split (composite) data received at input line 52 to output paths such as output lines 56-1, 56-2, . . . , 56-N. While three illustrative output lines are shown in FIG. 3, this is merely illustrative. If desired, the N number of output lines may be two lines, four lines, five lines, six lines, or greater than six lines.

Figure 4:
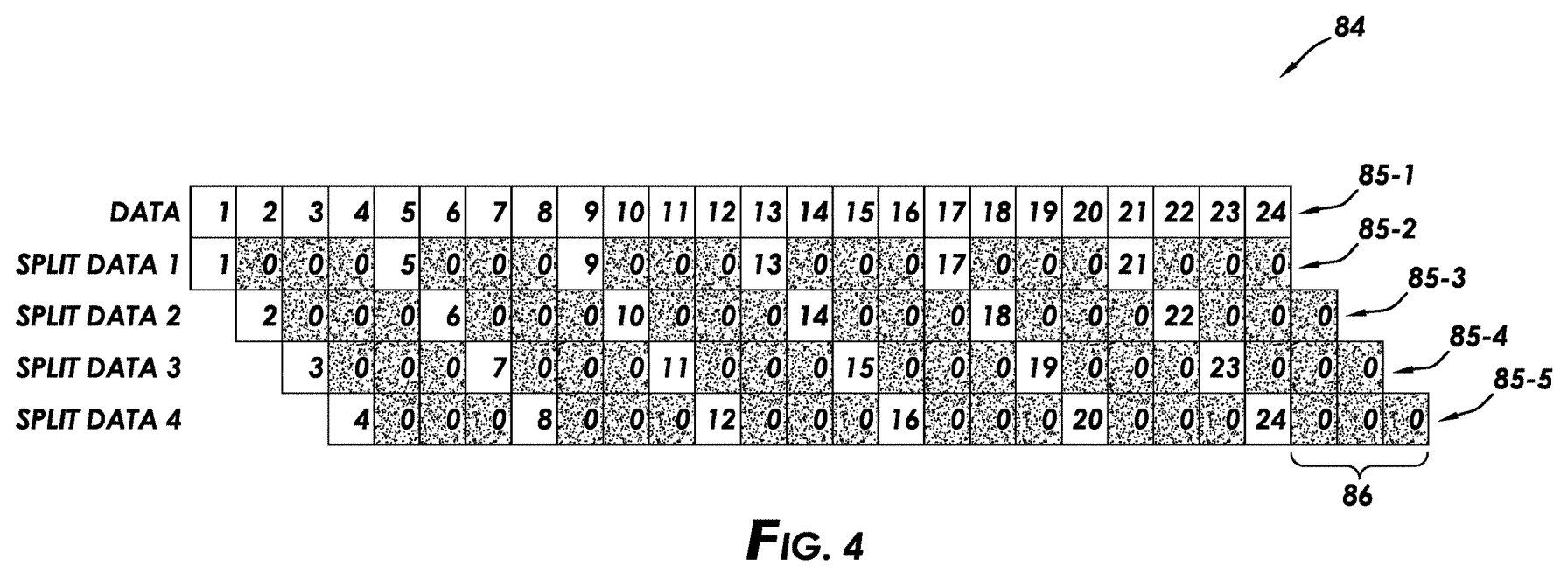

The manner in which the composite data stream is divided into multiple split data streams is illustrated in the diagram of FIG. 4. In particular, as shown in FIG. 4, table 84 may include five rows 85-1, 85-2, 85-3, 85-4, and 85-5, each indicative of a data stream. The topmost row 85-1 shows an illustrative input data stream. As an example, the topmost row shows 24 sets of bits that may be sequentially provided on input line 52 to demultiplexer 54. Each number 1-24 in the topmost row may be representative of one or multiple bits.

The remaining four rows show four separate output data streams. As an example, in an illustrative configuration in which four parallel output lines 56-1, 56-2, 56-3, and 56-4 are coupled to demultiplexer 54, the split data rows 85-2, 85-3, 85-4, 85-5 in FIG. 4 illustrate how the single data stream on the topmost row 85-1 may be demultiplexed across the four output lines.

In particular, demultiplexer 54 may sequentially pass a first input bit (or a first set of sequential input bits) to a first output line such as output line 56-1, a second input bit (or a second set of sequential bits) to a second output line such as output line 56-2, a third input bit (or a third set of sequential input bits) to a third output line such as output line 56-3, a fourth input bit (or a fourth set of sequential bits) to a fourth output line such as output line 56-4, a fifth input bit (or a fifth set of sequential bits) to first output line 56-1, a sixth input bit (or a sixth set of sequential bits) to second output line 56-2, a seventh input bit (or a seventh set of sequential bits) to third output line 56-3, an eighth input bit (or an eighth set of sequential bits) to fourth output line 56-4, a ninth input bit (or an ninth set of sequential bits) to first output line 56-1, and so on, until the $24^{th}$ input bit (or the $24^{th}$ set of sequential bits) is passed to fourth output line 56-4.

When a given output line 56 is not receiving input data from row 85-1, a suitable number of bit values '0' may be used to populate that output data stream. As shown in the example of FIG. 4, the first split data row 85-2 may include first input bit value followed by 3 bit values of '0', fifth input bit value followed by 3 bit values of '0', ninth input bit value followed by 3 bit values of '0', and so on, until the $21^{st}$ input bit value followed by 3 bit values of '0'. In a similar manner, bit values of '0' may be provided in the second, third, and fourth split data rows 85-3, 85-4, and 85-5 when the input data value is not being passed onto that output line.

To maintain split parallel output data streams of constant lengths with respect to the original input data stream, a suitable number of bit values of '0' may be appended to the end of split data streams at portion 86 after the $24^{th}$ input bit on row 85-1. As an example, split data row 85-2 may not need any additional appended bit values of '0' after the $24^{th}$ input bit, split data row 85-3 may include a single appended bit value of '0' after the $24^{th}$ input bit, split data row 85-4 may include two appended bit values of '0' after the $24^{th}$ input bit, and split data row 85-5 may include three appended bit values of '0' after the $24^{th}$ input bit.

Referring back to FIG. 3, each of the output lines 56 (56-1, 56-2, . . . , 56-N) providing a corresponding split output data stream may be received at a corresponding CRC (value) generator 58 (58-1, 58-2, . . . , 58-N). In an illustrative configuration with four parallel CRC generation paths, CRC generator 58-1 may generate CRC values based on the data stream on demultiplexer output line 56-1 such as values in split data row 85-2 of FIG. 4, CRC generator 58-2 may generate CRC values based on the data stream on demultiplexer output line 56-2 such as values in split data row 85-3 of FIG. 4, CRC generator 58-3 may generate CRC values based on the data stream on demultiplexer output line 56-3 such as values in split data row 85-4 of FIG. 4, and CRC generator 58-4 may generate CRC values based on the data stream on demultiplexer output line 56-4 such as values in split data row 85-5 of FIG. 4.

Each CRC generator 58 may compute its corresponding CRC value using any n-bit CRC divisor (e.g., n bits representing the polynomial) to generate the corresponding n-bit CRC value. In other words, each CRC generator 58 uses the same polynomial to generate the same type of CRC value. As examples, each of CRC generator 58 may calculate the 1-bit CRC value, the 3-bit CRC value, the 4-bit CRC value, the 8-bit CRC value, the 10-bit CRC value, the 12-bit CRC value, the 16-bit CRC value, the 32-bit CRC value, or any other desired n-bit CRC value.

Figure 6:
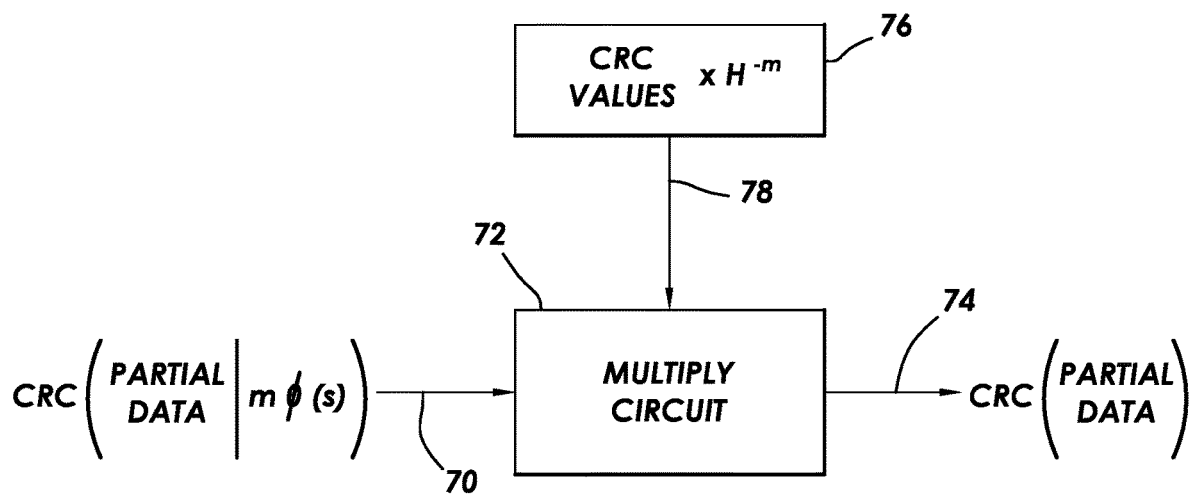
FIG. 6 is a diagram of an illustrative multiple circuit operating based on stored inverse transformation values in accordance with some embodiments.

To more efficiently compute the corresponding n-bit CRC value, each CRC generator 58 may be coupled to and access memory storing pre-computed CRC values, which are sometimes referred to as CRC transform values. As shown in FIG. 6, memory such as volatile and/or nonvolatile memory (e.g., shift registers, random-access memory, flash memory, hard drives, solid-state drives, etc.) may store CRC values 66 which are accessible by each corresponding CRC generator 58. In particular, each CRC generator 58 may access stored CRC values 66 in parallel along independent paths 68 (68-1, 68-2, . . . , 68-N).

CRC values 66 may be determined and stored prior to CRC generation circuitry 50 receiving an input data stream. As an example, in scenarios where CRC generators 58 are programmable to generate different bit length CRC values, CRC values 66 may be generated and stored during the start-up operation imaging system 10. As another example, in scenarios where CRC generators 58 are configured to generate fixed bit length CRC values, CRC values 66 may be generated and stored during manufacturing of imaging system 10. These CRC values may be hard-coded or non-programmable.

Because the splitting of the input data stream into multiple parallel split data streams (as shown in FIG. 4) produces a common set of data patterns, the number of CRC transform values to be stored can be quite small, thereby minimizing data storage requirements. In particular, the common set of data patterns refers to the format of a fixed number of split stream data bits followed by the inclusion of a fixed number of bit values '0'. Therefore, in some implementations, CRC values 66 may include precomputed values each corresponding to the CRC value associated with a data stream having a leading bit value of '1' at a different bit position in the above-mentioned format.

Taking FIG. 4 as an example, the format of the split data stream includes a single bit or set of bits (as indicated by each block 1-24) followed by three zeros. In the simplest illustrative example where a single input split data stream bit followed by three zeros is processed to generate a CRC4

(4-bit CRC) value, CRC values 66 may include a precomputed CRC value for only data bit pattern '1000'. In another illustrative example where three input split data stream bits followed by three zeros is processed to generate a CRC6 (6-bit CRC) value, CRC values 66 may include precomputed values for data bit patterns '001000', '010000', and '100000'. In yet another illustrative example where five input split data stream bits followed by three zeros is processed to generate a CRC8 (8-bit CRC) value, CRC values 66 may include precomputed CRC values for data bit patterns '00001000', '00010000', '00100000', '01000000', and '10000000'. Any precomputed CRC values following this pattern and used by CRC generator 58 such as those for CRC16, CRC32, or any other n-bit CRC algorithm may be stored as pre-determined CRC values 66.

Using the set of stored CRC values 66, CRC generators 58-1, 58-2, ..., 58-N may generate n-bit CRC values in parallel to each other on respective output paths 60 (60-1, 60-2, ..., 60-N) based on the same n-bit CRC generator algorithm. The CRC values generated by each CRC generator 58 may only be a partial CRC value with respect to the input data stream initially received on input path 52 because each of the split data streams on a path 56 received at a corresponding CRC generator 58 receives a different portion of the input data stream received on input path 52 (see, e.g., FIG. 4).

As shown in FIG. 3, each n-bit partial CRC value 62 (62-1, 62-2, ..., 62-N) generated by a corresponding CRC generator 58 may be stored temporarily on data storage structures or memories such as shift registers or other data storage structures or memories. A feedback path 64 may couple each of these data storage structures storing the partial CRC value 62 for the respective CRC generation path back to CRC generator 58.

In particular, each CRC generator 58 may generate an n-bit CRC value after each set of n bits in the input data stream has been received at CRC generator 58. In other words, each CRC generator 58 operates on n bits of the input data stream on line 56 at a time. More specifically, each CRC generator 58 may generate an updated n-bit partial CRC value based on n bits in the input data stream received on line 56, based on the stored (previously determined) n-bit partial CRC value received on line 64, and based on accessing stored pre-determined CRC values 66 accessed via line 68. In particular, one or more stored CRC values 66 may be accessed based on the input data stream on line 56. The accessed stored CRC values 66 may be applied to or be used to modify the fed back partial CRC value to generate the updated partial CRC value. Modifying the fed back partial CRC value may include a bit-wise exclusive OR operation.

The updated n-bit partial CRC value may then replace the previous partial CRC value and be stored on the corresponding data storage structure. Based on the above-mentioned scheme, as additional input data stream bits are continuously received by CRC generator 58, the corresponding partial CRC value 62 may be continuously updated.

If desired, a CRC seed value (or an initial CRC value) may be received at one or more CRC generators to initialize the CRC generation process. As shown in the example of FIG. 3, CRC generator 58-1 may receive an initial CRC value by path 59 and may use the initial CRC value to perform the first CRC generation operation with the first n-bits of input data stream on line 56-1. If desired, the CRC seed value may be stored as partial CRC value 62-1 and supplied to CRC generator 58-1 via feedback path 64-1.

Figure 5:
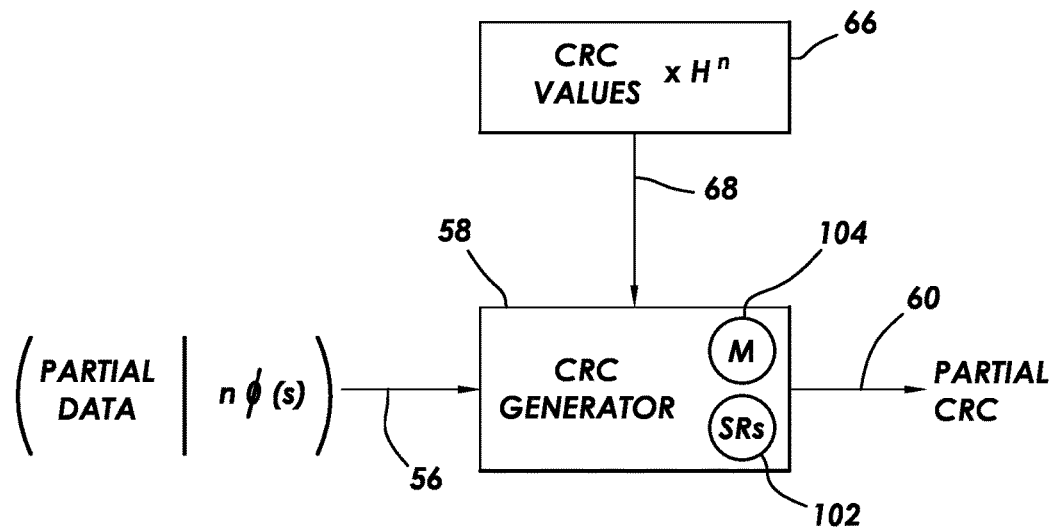
FIG. 5 is a diagram of an illustrative CRC generator operating based on stored transformation values in accordance with some embodiments.

FIG. 5 provides an illustrative diagram showing the relationship of the stored precomputed CRC values 66 relative to an illustrative partial CRC generation path. As shown in FIG. 5, a given CRC generator 58 (sometimes referred to as a CRC engine 58) may be implemented using one or more shift registers 102, one or more multiply and/or divide circuits 104, and/or one or more other arithmetic or data manipulation circuits to perform the CRC generation function.

As shown in FIG. 4 and described in connection with FIG. 3, input data received on line 56 by CRC generator 58 may have the format of a first portion of data bits split from the composite input data stream on line 52 followed by a second portion having n-bits of '0's. Accordingly, the stored CRC values 66 may include CRC values modified by a matrix $H^n$ that provides a transformation from first CRC values to second CRC values when the input data is appended by n number of '0's. In other words, by applying matrix $H^2$, the CRC value of bit pattern '1' may be transformed to the CRC value of bit pattern '100'. The stored CRC values 66 may include the CRC values after matrix $H^n$ has been applied since the input data stream have the format of input data appended by n-bits of '0's based on how the data is split.

By accessing one or more of pre-computed stored CRC values 66 instead of performing the division operation to calculate the partial CRC value, the partial CRC values may be generated more quickly and efficiently. Given the fixed format of the input data stream (e.g., data appended by '0's), the number of stored CRC values 66 may also be reduced, thereby reducing storage requirements for CRC values 66.

The feedback path 64 is not shown in FIG. 5 in order not to unnecessarily obscure the embodiments of FIG. 5. As described in connection with FIG. 3, the stored partial CRC value may be fed back to CRC generator 58, and the accessed stored CRC values 66 may be applied to or used to modify the fed back partial CRC value based on the input data stream on line 56 to generate each new iteration of partial CRC values for temporary storage.

After generation of a final set of partial CRC values 62-1, 62-2, ..., 62-N for the dataset, all of the partial CRC values may be combined to generate the final complete CRC value for the dataset. For example, the dataset may be a frame captured using image sensor array 32. Referring back to FIG. 3, CRC generation circuitry 50 may receive image or video data generated by image sensor array 32 at its input path 52. In some illustrative configurations, a CRC value may be calculated for each full image frame. As such, after all of the data associated with the image frame has been processed by one of the CRC generators 58 to generate partial CRC values, the partial CRC values may be combined to generate the final complete CRC value for the image frame.

In some implementations, prior to this combination operation, CRC generation circuitry 50 may remove artifacts in one or more partial CRC values caused by the data splitting process. In particular, as described in connection with FIG. 4, a number of the split data streams may have one or more extra '0' bits appended to the end of the split data stream, which were not present in the original composite input data stream. This portion is shown in FIG. 4 as portion 86. As such, CRC generation circuitry 50 may remove the effects of the one or more extra '0' bits on the partial CRC values prior to combination.

To remove the effects of the one or more extra '0' bits on the partial CRC values, CRC generation circuitry 50 may include a plurality of multiply circuits 72-1, 72-2, ..., 72-N, each coupled along a corresponding partial CRC generation path and configured to receive a corresponding partial CRC value 62. The multiply circuits may sometimes be referred to as a normalizer because the multiple circuits normalize the partial CRC values to negate the different numbers of extra '0' bits added during the split process.

In particular, each multiply circuit 72 (72-1, 72-2, ..., 72-N) may access stored precomputed CRC values 76 independently via corresponding parallel paths 78 (78-1, 78-2, ..., 78-N) to modify the partial CRC values based on the number of appended extra '0' bits. Pre-computed CRC values 76 may be computed and stored in the same manner as described for pre-computed CRC values 66.

FIG. 6 provides an illustrative diagram showing the relationship of the stored precomputed CRC values 76 relative to an illustrative partial CRC generation path. As an example, a given multiply circuit 72 may be implemented by any suitable type of logic circuitry to implement a (binary) multiplier.

Multiply circuit 72 may receive an input partial CRC value on line 70. The input partial CRC value may be a CRC value generated based on a data stream appended with m number of '0' bits. In the example of FIG. 4, the partial CRC value associated with row 58-3 may be generated based on a split data stream appended with 1 '0' bit in portion 86 (e.g., m is equal to one), the partial CRC value associated with row 58-4 may be generated based on a split data stream appended with 2 '0' bits in portion 86 (e.g., m is equal to two), and the partial CRC value associated with row 58-5 may be generated based on a split data stream appended with 3 '0' bits in portion 86 (e.g., m is equal to two).

Based on how many zero-bits were appended to the split data stream, multiply circuit 72 may access a different stored pre-computed CRC value 76. As examples, a first stored pre-computed CRC value 76 may be one associated with removing the effects on the partial CRC value with the inclusion of one extra '0' bit appended to the input data stream, a second stored pre-computed CRC value 76 may be one associated with removing the effects on the partial CRC value with the inclusion of two extra '0' bits appended to the input data stream, and so on until the last stored pre-computed CRC value 76 associated with removing the effects on the partial CRC value with the inclusion of $m_{max}$ (the maximum value of m) extra '0' bits appended to the input data stream.

In particular, as shown in FIG. 6, the stored CRC values 76 may include CRC values modified by a matrix $H^{-m}$ that provides a transformation from first CRC values generated based on input data appended by m number of '0's to second normalized CRC values generated as if the input data were not appended by m number of '0's. In other words, by applying matrix $H^{-2}$, the CRC value of bit pattern '100' may be transformed to the CRC value of bit pattern '1'. The stored CRC values 76 may include the CRC values after matrix $H^{-m}$ has been applied since the input partial CRC value on line 70 is affected by the inclusion of m-bits of '0's to the split data stream. Multiply circuit 72 may apply one of the pre-computed CRC values to the partial CRC value received on line 70, thereby generating the normalized CRC value on line 74.

Different multiply circuits 72 (72-1, 72-2, ..., 72-N in FIG. 3) may access different pre-computed values 76 given that different numbers of '0' bits were appended to the different split data streams. Referring back to FIG. 3, as an example, multiply circuit 72-1 may implemented or be configurable as a bypass circuit if the partial CRC generation path to which it is coupled generated the partial CRC value associated with the data stream in row 85-2 in FIG. 4 because data stream in row 85-2 has no appended '0' bits in portion 86. As another example, multiply circuit 72-2 may implemented or be configurable to access the stored CRC value modified by matrix $H^{-1}$ if the partial CRC generation path to which it is coupled generated the partial CRC value associated with the data stream in row 85-3 in FIG. 4 because data stream in row 85-3 has 1 appended '0' bit in portion 86.

Based on the normalization operation performed at the normalizer or plurality of multiply circuits coupled to the output of each partial CRC value generation path, normalized partial CRC values may be output from multiply circuits 72 and provided on paths 74-1, 74-2, ..., 74-N. The normalized partial CRC values may be combined using a data combiner such as exclusive OR (XOR) logic circuitry 80 configured to perform bitwise exclusive OR logic operations for the bits in each bit position across of the partial CRC values. In such a manner, XOR logic circuitry 80 may combine the plurality of partial CRC values to generate a final CRC value for the entirety of the input data stream (e.g., associated with an image frame) on output path 82 of CRC generation circuitry 50.

If desired, the normalization operation and the final XOR operation may occur during a blanking period of operation of the image sensor from which the input data stream is provided. As an example, a blanking period may occur after reading out an entire image frame, after reading out multiple image frames, after reading out a portion of an image frame, or at any other suitable time period. In contrast, the generation and update of partial CRC values may occur continuously during the operation of the image sensor such as while image data is being gathered and subsequently conveyed to CRC generation circuitry 50.

By continuously operating a portion of CRC generation circuitry 50 such as the parallel partial CRC generation paths and the corresponding CRC generators coupled along the paths, CRC generation circuitry 50 may have improved throughput and data rate characteristics. While some time overhead may be associated with normalizing and combining the partial CRC values, by overlapping the normalization and partial CRC value combination operations with blanking periods, this time overhead may also be minimized.

Furthermore, splitting the input data stream in the manner as illustrated by the example of FIG. 4 further enables parallel partial CRC generation while using pre-computed values that are relatively small in size. The example of the data splitting as shown in FIG. 4 is merely illustrative. If desired, input data may be split between less than four parallel paths or more than four parallel paths, or generally between any number of parallel data paths.

The foregoing is merely illustrative and various modifications can be made to the described embodiments. The foregoing embodiments may be implemented individually or in any combination.

What is claimed is:

1. Cyclic Redundancy Check value calculation circuitry comprising:
   a demultiplexer that receives an input data bit stream and outputs a plurality of split data bit streams based on the input data bit stream, wherein each split data bit stream in the plurality of split data bit streams includes one or more inserted bits;
   a plurality of Cyclic Redundancy Check value generators that each generate a partial Cyclic Redundancy Check value based on a corresponding split data bit stream in the plurality of split data bit streams;
   logic circuitry coupled to each Cyclic Redundancy Check value generator in the plurality of Cyclic Redundancy Check value generators and that generates a final Cyclic Redundancy Check value based on the partial Cyclic Redundancy Check values; and a Cyclic Redundancy Check value data storage structure that stores a plurality of pre-computed Cyclic Redundancy Check values accessible by each Cyclic Redundancy Check value generator in the plurality of Cyclic Redundancy Check value generators.

2. The Cyclic Redundancy Check value calculation circuitry defined in claim 1, wherein a given split data bit stream in the split data bit streams includes a first portion from the input data bit stream and a second portion from the input data bit stream separated from the first portion by the one or more inserted bits.

3. The Cyclic Redundancy Check value calculation circuitry defined in claim 2,
wherein a given Cyclic Redundancy Check value generator of the plurality of Cyclic Redundancy Check value generators receives the given split data bit stream and wherein the Cyclic Redundancy Check value data storage structure provides one of the plurality of stored pre-computed Cyclic Redundancy Check values to the given Cyclic Redundancy Check value generator to generate a given partial Cyclic Redundancy Check value.

4. The Cyclic Redundancy Check value calculation circuitry defined in claim 3, wherein the Cyclic Redundancy Check value data storage structure provides the one of the plurality of stored pre-computed Cyclic Redundancy Check values based on a length of the one or more inserted bits in the given split data bit stream.

5. The Cyclic Redundancy Check value calculation circuitry defined in claim 1, wherein the one or more inserted bits are absent from the input data bit stream.

6. The Cyclic Redundancy Check value calculation circuitry defined in claim 1, wherein the logic circuitry comprises exclusive OR logic circuitry.

7. The Cyclic Redundancy Check value calculation circuitry defined in claim 6 further comprising:
a plurality of multiply circuits each coupled to a corresponding one of the plurality of Cyclic Redundancy Check value generators.

8. The Cyclic Redundancy Check value calculation circuitry defined in claim 7, wherein each of the plurality of multiply circuits has an output coupled the exclusive OR logic circuitry.

9. The Cyclic Redundancy Check value calculation circuitry defined in claim 7 further comprising:
an additional Cyclic Redundancy Check value data storage structure coupled to each of the plurality of multiply circuits.

10. The Cyclic Redundancy Check value calculation circuitry defined in claim 9, wherein the additional Cyclic Redundancy Check value data storage structure stores pre-computed Cyclic Redundancy Check values associated with removing appended bits from the plurality of split data bit streams.

11. The Cyclic Redundancy Check value calculation circuitry defined in claim 1, wherein the input data bit stream comprises image data and wherein the final Cyclic Redundancy Check value is a Cyclic Redundancy Check value of the image data.

12. The Cyclic Redundancy Check value calculation circuitry defined in claim 1, wherein the plurality of Cyclic Redundancy Check value generators are coupled along respective parallel paths between the demultiplexer and the logic circuitry.

13. The Cyclic Redundancy Check value calculation circuitry defined in claim 1, wherein each partial Cyclic Redundancy Check value in the plurality of partial Cyclic Redundancy Check values is generated based on a bit stream ending with one or more bits with a same value.

14. The Cyclic Redundancy Check value calculation circuitry defined in claim 13, wherein the pre-computed plurality of Cyclic Redundancy Check values contain pre-computed plurality of Cyclic Redundancy Check values for bit streams ending with the one or more bits with the same value.

15. The Cyclic Redundancy Check value calculation circuitry defined in claim 14, wherein the logic circuitry is configured to perform a bit-wise exclusive OR operation on the partial Cyclic Redundancy Check values to generate the final Cyclic Redundancy Check value.

16. The Cyclic Redundancy Check value calculation circuitry defined in claim 1 further comprising:
a normalizer coupled between the logic circuitry and the plurality of Cyclic Redundancy Check value generators.

17. The Cyclic Redundancy Check value calculation circuitry defined in claim 16 further comprising:
an additional Cyclic Redundancy Check value data storage structure, wherein the normalizer includes a plurality of multiply circuits each coupled to the additional Cyclic Redundancy Check value data storage structure.

18. The Cyclic Redundancy Check value calculation circuitry defined in claim 1, wherein the logic circuitry is configured to combine the partial Cyclic Redundancy Check values to generate the final Cyclic Redundancy Check value during a time period and wherein the plurality of Cyclic Redundancy Check value generators are each configured to generate the partial Cyclic Redundancy Check value outside of the time period.

19. An imaging system comprising:
an image sensor; and
Cyclic Redundancy Check value calculation circuitry coupled to the image sensor and comprising:
a demultiplexer that receives an input data bit stream and outputs a plurality of split data bit streams based on the input data bit stream;
a first Cyclic Redundancy Check value generator that generates a first partial Cyclic Redundancy Check value based on a first split data bit stream in the plurality of split data bit streams;
a second Cyclic Redundancy Check value generator that generates a second partial Cyclic Redundancy Check value based on a second split data bit stream in the plurality of split data bit streams;
a Cyclic Redundancy Check value data storage structure that stores a plurality of Cyclic Redundancy Check values prior to the demultiplexer receiving the input data bit stream, the stored plurality of Cyclic Redundancy Check values being accessible by the first and second Cyclic Redundancy Check value generators; and
logic circuitry that generates a final Cyclic Redundancy Check value based on the first partial Cyclic Redundancy Check value and the second partial Cyclic Redundancy Check value.

20. Cyclic Redundancy Check value calculation circuitry comprising:
a demultiplexer that receives an input data bit stream and outputs a plurality of split data bit streams based on the input data bit stream, wherein each split data bit stream in the plurality of split data bit streams includes one or more inserted bits;

a plurality of Cyclic Redundancy Check value generators that each generate a partial Cyclic Redundancy Check value based on a corresponding split data bit stream in the plurality of split data bit streams;

logic circuitry coupled to each Cyclic Redundancy Check value generator in the plurality of Cyclic Redundancy Check value generators and that generates a final Cyclic Redundancy Check value based on the partial Cyclic Redundancy Check values, wherein the logic circuitry comprises exclusive OR logic circuitry; and a plurality of multiply circuits each coupled to a corresponding one of the plurality of Cyclic Redundancy Check value generators.

* * * * *